United States Patent
Goldman

(10) Patent No.: US 7,570,043 B2
(45) Date of Patent: Aug. 4, 2009

(54) SWITCHES BIDIRECTIONALLY CONNECTING EXTERNAL LEAD TO PLL VOLTAGE TUNE LINE

(75) Inventor: Stanley J. Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 11/618,603

(22) Filed: Dec. 29, 2006

(65) Prior Publication Data

US 2008/0157888 A1 Jul. 3, 2008

(51) Int. Cl.
G01R 31/02 (2006.01)
G01R 23/12 (2006.01)

(52) U.S. Cl. .................. 324/72.5; 324/76.53; 331/16
(58) Field of Classification Search .............. 324/72.5, 324/76.53; 331/16, 34, 175, 177 R
See application file for complete search history.

(56) References Cited

U.S. PATENT DOCUMENTS

| 5,745,011 | A | * | 4/1998 | Scott | 331/44 |
| 6,292,522 | B1 | * | 9/2001 | Jeng et al. | 375/376 |
| 6,611,176 | B1 | * | 8/2003 | Goldman | 331/17 |
| 7,061,223 | B2 | * | 6/2006 | Boerstler et al. | 324/76.53 |
| 7,265,633 | B1 | * | 9/2007 | Stiff | 331/16 |
| 2004/0263146 | A1 | * | 12/2004 | Boerstler et al. | 324/76.53 |
| 2008/0111636 | A1 | * | 5/2008 | Tanis | 331/16 |

* cited by examiner

*Primary Examiner*—Timothy J Dole
(74) *Attorney, Agent, or Firm*—Lawrence J. Bassuk; W. James Brady; Frederick J. Telecky, Jr.

(57) ABSTRACT

An integrated circuit, a phase locked loop, a voltage tune probe and a method of screening an integrated circuit employing a phase locked loop thereof. In one embodiment, the integrated circuit includes: (1) an input/output port configured to provide an external interface lead for the integrated circuit, (2) a phase locked loop having a voltage tune line coupled to a voltage controlled oscillator and (3) a voltage tune probe having a first switch coupled to a second switch and a capacitor coupled therebetween. The first switch is coupled to the voltage tune line and the second switch is coupled to the input/output port. The switches provide a bidirectional connection between the external interface lead and the voltage tune line.

20 Claims, 2 Drawing Sheets

SWITCHES BIDIRECTIONALLY CONNECTING EXTERNAL LEAD TO PLL VOLTAGE TUNE LINE

TECHNICAL FIELD OF THE INVENTION

The invention is directed, in general, to voltage tune lines of phase locked loops and, more particularly, to probing the voltage tune line of a phase locked loop.

BACKGROUND OF THE INVENTION

A phase-locked loop (PLL) is often used to generate clock signals. As well known in the art, a PLL is an electronic circuit that oscillates at a desired frequency and automatically adjusts the phase of its oscillation to match (lock on) that of an input signal. The PLL includes an oscillator, which is often a voltage-controlled oscillator (VCO). A VCO typically includes inverters configured in a ring. An odd number of inverters is needed to oscillate.

In addition to the VCO, a conventional PLL may include a phase/frequency detector to convert a phase difference to a pulse width modulated (PWM) error signal, a charge pump and lag lead loop filter to convert the phase error to a control voltage and a buffer amplifier that converts the high impedance control voltage to a low impedance drive for a VCO tune line. The VCO converts the control voltage to an output phase. A programmable divider at the VCO output feeds the divided-down VCO phase back to the phase detector input to complete the loop.

In general, a PLL operates by converting a pulsed error voltage to a DC voltage that is used to control the VCO. This DC control voltage causes the VCO to slightly change the output signal of the VCO in a direction that reduces the phase difference and also the frequency difference between the input and output signals. This error correcting cycle is repeated for each reference frequency cycle period, ultimately resulting in a minimum difference between the two frequencies. The phase locked loop is described as "locked" when the phase difference between the two signals has stabilized.

Sensing the voltage tune line provides valuable information about how a PLL is operating. For example, access to a voltage tune line in test allows a VCO tune curve to be tested, frequency step response to be measured for stability, frequency acquisition to be measured for power up lock time, the lock range to be measure, and coupled spurious signals to be measured.

The voltage tune line of the VCO in a PLL with a charge pump, however, is a sensitive point to probe. For example, for a 10 GHz/V VCO gain and a 10 MHz modulation frequency, a coupled voltage level due to a voltage tune line probe should be less than 1uV in order to maintain a sideband level less than −60dBc. Additionally, extending a line out from the voltage tune line to a test pad, or port, in a system on a chip provides a path for signals to be coupled to a voltage tune line. This is evident in a PLL with a charge pump that presents a high impedance point connection to the PLL. Consequently, direct contact with the voltage tune line can couple in spurious signals to the PLL and shift a phase error thereof so that reference sidebands get significantly larger. All of these effects can cause jitter at an output of the PLL.

Accordingly, what is needed in the art is a system and method to assess the voltage tune line of a PLL to obtain measurements with a reduced disturbance to the PLL. What is also needed in the art is a system and method to assess the voltage tune line of a PLL to obtain measurements with minimal disturbance to the PLL.

SUMMARY OF THE INVENTION

To address the above-discussed deficiencies of the prior art, the invention provides, in one aspect, an integrated circuit. In one embodiment, the integrated circuit includes: (1) an input/output port configured to provide an external interface lead for the integrated circuit, (2) a phase locked loop having a voltage tune line coupled to a voltage controlled oscillator and (3) a voltage tune probe having a first switch coupled to a second switch and a capacitor coupled therebetween. The first switch is coupled to the voltage tune line and the second switch is coupled to the input/output port. The switches provide a bidirectional connection between the external interface lead and the voltage tune line.

In another aspect, the invention provides a phase locked loop. In one embodiment the phase locked loop includes: (1) an input node for receiving a reference frequency, (2) a phase detector including a first input, a second input and an output, the first input coupled to the input node, (3) an active compensation network including an input and an output, the input coupled to the output of the phase detector (4) a voltage controlled oscillator including a control input coupled to the output of the active compensation network via a voltage tune line, and having an output providing an output of the phase locked loop and (5) a voltage tune probe coupled to the voltage tune line and including a first switch, a second switch and a capacitor coupled therebetween, the first and second switch configured to connect the voltage tune line to an interface external to the phase locked loop.

In yet another aspect, the invention provides a voltage tune probe. In one embodiment, the voltage tune probe includes: (1) a first switch coupled to a voltage tune line of a phase locked loop, (2) a second switch coupled to the first switch and an input/output port that provides an interface external to the phase locked loop and (3) a capacitor coupled between the first and second switches.

In still another aspect, the invention provides a method of screening an integrated circuit employing a phase locked loop thereof. In one embodiment, the method includes: (1) connecting a voltage tune line of the phase locked loop to an external interface employing a voltage tune probe, (2) applying a voltage source to the external interface to drive a voltage controlled oscillator of the phase locked loop and (3) determining if the voltage controlled oscillator produces an output.

The foregoing has outlined some aspects of the invention so that those skilled in the pertinent art may better understand the detailed description that follows. Additional features will be described hereinafter that form the subject of the claims. Those skilled in the pertinent art should appreciate that they can readily use the disclosed conception and specific embodiment as a basis for designing or modifying other structures for carrying out the same purposes of the invention. Those skilled in the pertinent art should also realize that such equivalent constructions do not depart from the scope of the invention.

DETAILED DESCRIPTION

Figure 1:
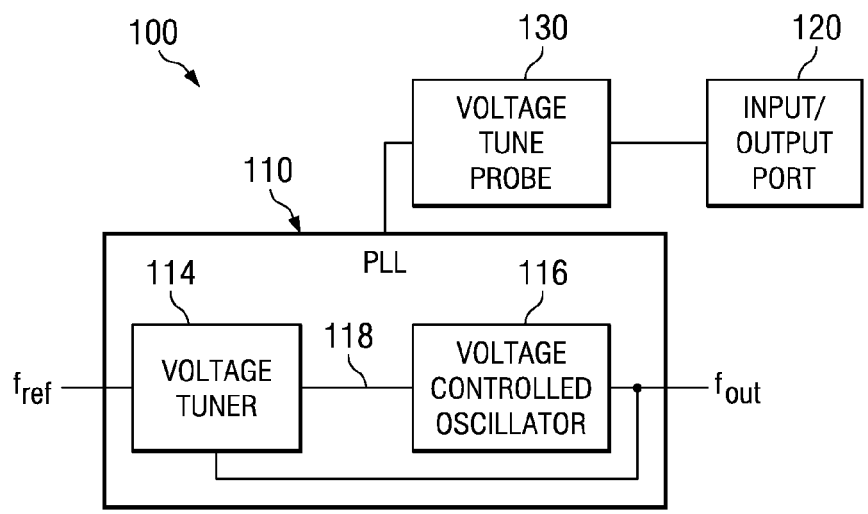
FIG. 1 illustrates a block diagram of an embodiment of an integrated circuit including a phase locked loop constructed according to the principles of the invention.

Referring initially to FIG. 1, illustrated is an embodiment of an integrated circuit (IC), generally designated 100, constructed according to the principles of the invention. The IC 100 includes a phase locked loop (PLL) 110, an input/output port 120 and a voltage tune probe 130.

The PLL 110 is configured to generate an output signal ($f_{out}$) with a frequency that is a multiple of an input reference signal ($f_{ref}$) in a manner that synchronizes (or locks) the relationship between the phases and frequencies of the reference signal $f_{ref}$ and the output signal $f_{out}$. The PLL 110 includes a voltage tuner 114 coupled to a voltage controlled oscillator (VCO) 116 via a voltage tune line 118. The voltage tuner 114 provides a tuning voltage on the voltage tune line 118 to drive the VCO 116. One skilled in the art will understand that the PLL 110 may include additional circuitry or components typically included in a PLL, such as a phase detector and a programmable divider, that are not illustrated or discussed.

The voltage tuner 114 may include a conventional charge pump and lag lead loop filter to provide the tuning voltage. Instead of a charge pump, in other embodiments the voltage tuner 114 may include an active compensation network having an operational amplifier to provide the tuning voltage. For example, the voltage tuner 114 may be an active compensation network as disclosed in an active compensation PLL of U.S. Pat. No. 6,611,176 which is incorporated herein by reference in its entirety.

The input/output port 120 is a port without an input or output buffer that provides an interface from outside of the IC 100 to circuitry therein, such as the PLL 110. The input/output port 120 may be a pass-through port. One skilled in the art will understand the configuration and operation of the input/output port 120.

The voltage tune probe 130 allows monitoring of the voltage tune line 118 via the input/output port 120 by connecting the voltage tune line 118 to the input/output port 120 when a first switch and a second switch are each activated (turned on). Additionally, the voltage tune probe 130 includes a capacitor coupled between the first and second switch. In some embodiments, the capacitor has a capacitance of about two pico-farads and the first and second switches are transistors. The capacitance of the capacitor cooperates with a resistance associated with the first and second switches to filter voltages associated with the voltage tune line 118 and the input/output port 120. In some embodiments, the first and second switch have a combined resistance when activated that is at most one fourth a drive resistance of the operational amplifier of the voltage tuner 114 when present.

The voltage tune probe 130 also includes a controller that operates (turns on and off) the first and second switches. The controller turns on (activates) the switches based on input signals that indicate monitoring of the voltage tune line 118 or testing of the VCO 116. During normal operation of the PLL 110, the switches are turned off (deactivated). During testing of the VCO 116, the operational amplifier of the voltage tuner 114 if present is disabled to provide a high impedance state. In some embodiments, the controller may be a logic gate. The operation and configuration of the voltage tune probe 130 is discussed in more detail below with respect to FIG. 2.

Figure 2:
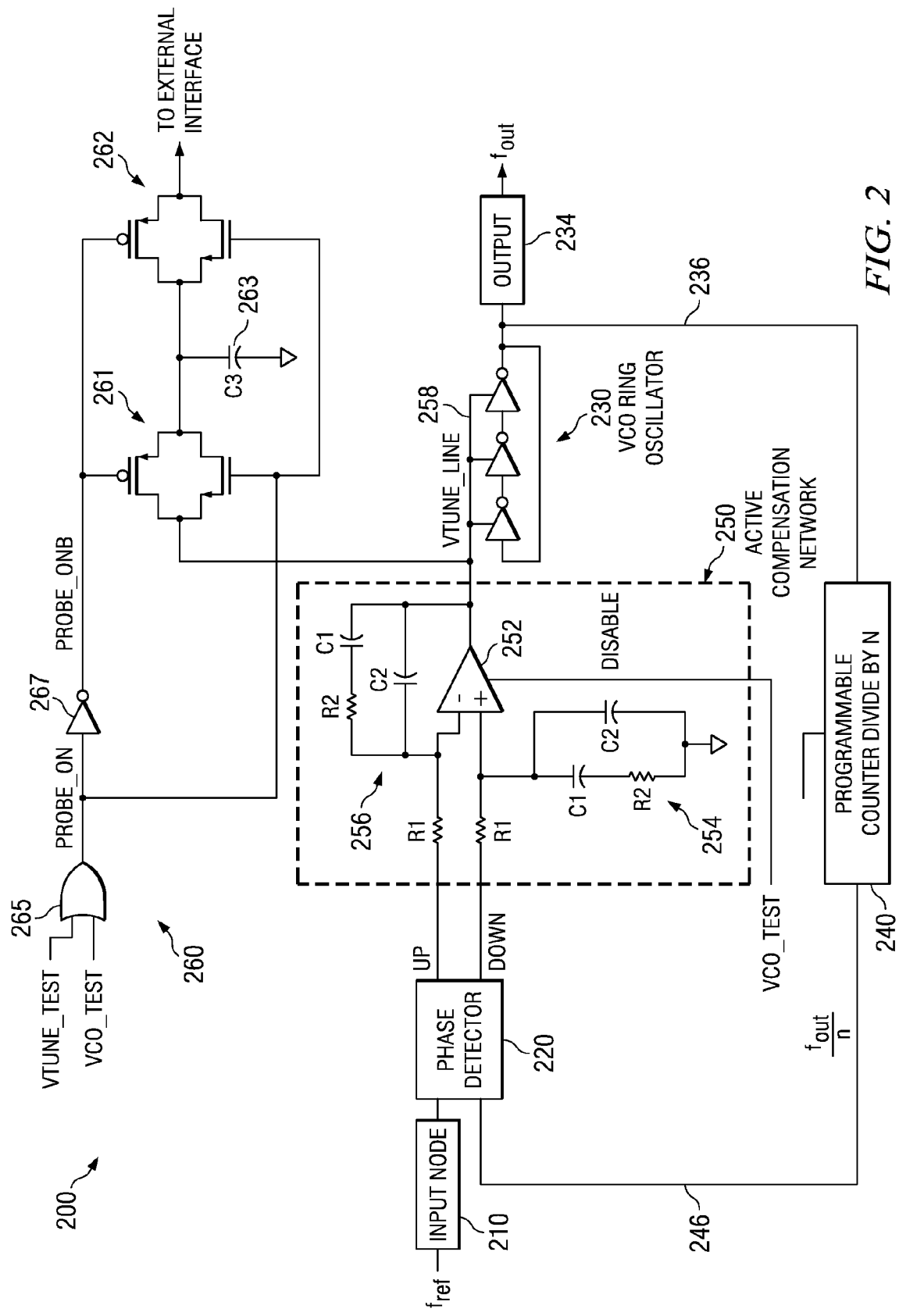
FIG. 2 illustrates a schematic diagram of an embodiment of a phase locked loop including a voltage line tuning probe constructed according to the principles of the invention.

Turning now to FIG. 2, illustrated is a schematic diagram of an embodiment of a phase locked loop (PLL), generally designated 200, constructed according to the principles of the invention. The PLL 200 contains some components that are found in conventional PLLs including an input node 210, a phase detector 220, a voltage controlled oscillator (VCO) 230 and a programmable divider 240. One skilled in the art will understand that the PLL 200 may include additional components typically included in a conventional PLL that are not illustrated or discussed.

The input node 210 is configured to receive a signal source having a reference signal ($f_{ref}$). The PLL 200 generates an output signal ($f_{out}$) with a frequency that is a multiple of the input reference signal $f_{ref}$ in a manner that synchronizes (or "locks") the relationship between the phases and frequencies of the reference signal $f_{ref}$ and the output signal $f_{out}$.

The VCO 230 is used to multiply the reference signal $f_{ref}$ by a factor of n to generate the output signal $f_{out}$. In order to compare the output signal $f_{out}$ with the reference $f_{ref}$, the generated output from the VCO 230 $f_{ref}$ is provided to the phase detector 220 via the programmable divider 240 that divides the output signal $f_{out}$ by n.

In addition to receiving the output signal $f_{out}$ divided by n, $f_{out/n}$, the phase detector 220 is also configured to receive the reference signal $f_{ref}$ from the input node 210. The phase detector 220 produces a pulse error voltage on each rising edge of the reference signal $f_{ref}$ that has a pulse width equal to the phase difference between the reference signal $f_{ref}$ and the output signal divided by n $f_{out/n}$.

In addition to the above components, the PLL 200 also includes an active compensation network 250 that includes an operational amplifier (op amp) 252, a first resistor/capacitor network 254 and a second resistor/capacitor network 256. Accordingly, the invention provides a PLL with active filter compensation on an integrated circuit in combination with a novel voltage tune probe. Previously, such a PLL was difficult due to the physical space required for the high performance op amp required for these circuits, as well as the physical size of required capacitors. (An active filter is defined as a filter with an op amp in the loop compensation circuit.)

The output of the op amp 252 drives the VCO 230 providing output signal $f_{out}$ at output 234. The op amp 252 is connected to the VCO 230 via a voltage tune line 258. The output signal $f_{out}$ drives the programmable divider 240 via lead 236. The output of programmable divider 240 connects to a second input of the phase detector 220 on a lead 246.

Commercially-available, representative devices for implementation of the PLL 200 include Motorola's MC12040 for the phase detector 220, Texas Instruments' TI OP27 for the op amp 252, Motorola's MC 1648 for the VCO 230, and Texas Instruments' TI 74163 for the programmable divider 240. U.S. Pat. No. 6,611,176 provides additional information regarding the active compensation network 250.

Coupled to the output of the active compensation network 250 at the voltage tune line 258 is a voltage tune probe 260. The voltage tune probe 260 includes a first switch 261, a second switch 262 and a capacitor 263 coupled therebetween. Additionally, the voltage tune probe 260 includes a logic gate 265 and an inverter 267. The first and second switches 261, 262, are configured to connect the voltage tune line 258 to an external interface to allow monitoring of the voltage tune line 258. The logic gate 265 is configured to receive inputs and control the first and second switches 261, 262, based on the inputs. The inverter 267 is used to provide the proper signal to the first and second switches 261, 262, as illustrated in FIG. 2. Also, as illustrated, the first and second switches 261, 262, are transistors. The first and second switches 261, 262, may be referred to as bidirectional pass gates or transmission gates.

The voltage tune probe 260 has three modes. In a first mode, the first and second switches 261, 262, are on and there is an output connection from the voltage tune line 258 that allows monitoring of the tune voltage from the op amp 252 at the external interface lead while the loop is locked. When activated, the resistance (on resistance) of the first and second switches 261, 262, is one fourth (approximately 100 ohms) of the drive resistance (approximately 400 ohms) of the op amp 252. Additionally, the combination of this resistance with the capacitor 263 filters the tune voltage going out and reciprocally filters out signals from coupling in to the voltage tune line 258. The input signal "VTUNE_TEST" represents the first mode in FIG. 2.

In a second mode, the first and second switches 261, 262, remain on and the op amp 252 is set to a high impedance state. This is achieved by disabling the op amp 252. This allows a voltage to be connected to the voltage tune probe 260 via an external interface and control the VCO 230. In the second mode, a voltage versus frequency curve can be generated, which is a key test for determining problems with the VCO 230. Also, the second mode allows the VCO 230 to have fixed DC voltage connected to run at one frequency. Because the loop is turned off in this mode, the effects of the loop on the VCO 230 can be studied. Noise coupling from the phase detector 220 into the VCO 230 is an example. Also the effects of coupling after the VCO 230 by output buffers and multiplexers (not illustrated) can be more easily identified. The input signal "VCO_TEST" represents the second mode in FIG. 2. As illustrated in FIG. 2, VCO_TEST is applied to both the logic gate 265 and the op amp 252.

For the third mode, the first and second switches 261, 262, are turned off (no input signal applied to the logic gate 265) and the op amp 252 is turned back on (enabled) to put the loop in its normal operating mode. Now the combination of the off resistance of the first and second switches 261, 262, in combination with the capacitor 263 filters out signals from coupling into the voltage tune line 258. The off resistance of the first and second switches 261, 262, can be about three megaohms. This high resistance minimizes the loading on the output of the op amp 252.

Figure 3:
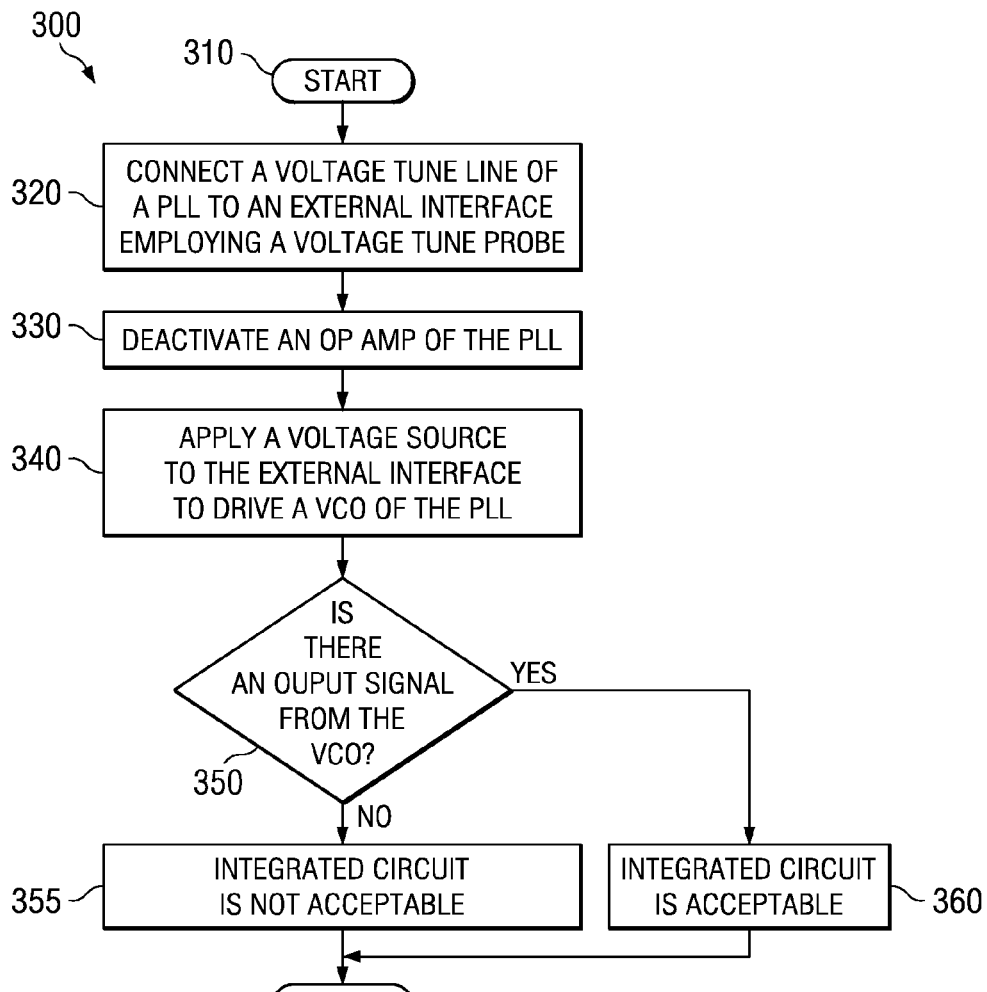
FIG. 3 illustrates a flow diagram of an embodiment of a method of screening an integrated circuit employing a phase locked loop of the integrated circuit carried out according to the principles of the invention.

Turning now to FIG. 3, illustrated is a method of screening an integrated circuit 300 employing a phase locked loop thereof carried out according to the principles of the invention. The method of screening 300 begins with an intent to perform a quality check of an integrated circuit in a step 310.

After starting, a voltage tune line of a phase locked loop is connected to an external interface employing a voltage tune probe in a step 320. The voltage tune probe includes a first switch coupled to a second switch and a capacitor coupled therebetween. The voltage tune line and the external interface are connected by activating the first and second switch.

After connecting, an operational amplifier for driving a VCO of the phase locked loop is deactivated in a step 330. The operational amplifier may be turned off by applying a signal thereto to disable it. The operational amplifier may be part of active compensation network of the phase locked loops.

After deactivating the operational amplifier, a voltage source is applied to the external interface to drive a voltage controlled oscillator of the phase locked loop in a step 340. The voltage source may be a DC voltage connected to run the voltage controlled oscillator at one frequency. Of course, different DC voltages may be applied.

After applying the voltage source, a determination is made if the voltage controlled oscillator produces an output in a decisional step 350. If an output is produced, the integrated circuit with the PLL is deemed acceptable in a step 360. The method 300 then ends in a step 370. If an output is not produce, the integrated circuit is deemed unacceptable in a step 355. The method then ends in step 370.

As indicated above, the invention provides a voltage tune probe that minimizes the level of coupled signals into a VCO and minimizes the loading on a voltage tune line so that a loop of a PLL does not self generate modulation to correct for a loading effect. Unlike other solutions, a voltage tune probe constructed according to the principles of the invention does not significantly load down the voltage tune line so that the phase detector generates a wider pulse width to over come this effect. Accordingly, higher reference sidebands are not generated in the loop which significantly degrades the performance of the loop. An AC simulation of the attenuation of a voltage tune probe indicated about a 3 dB bandwidth out to 5 MHz when the switches are not activated.

Additionally, the invention provides a PLL with active filter compensation on an integrated circuit in combination with the novel voltage tune probe. Previously, such a PLL was difficult due to the physical space previously required for the high performance operational amplifier (op amp) required for these circuits, as well as the physical size of required capacitors. (An active filter is defined as a filter with an op amp in the loop compensation circuit.) Also, when using an active filter loop, the invention recognizes that a high impedance probe point can be avoided so that signals are not easily coupled into the VCO causing other modulations to appear on the output of the VCO which further degrades the performance of the PLL. The combination of a PLL architecture that has a low drive impedance to tune the VCO and a tune probe that consists of switches and a filtering capacitor allows the PLL to be probed with a minimum effect on performance.

Although the invention has been described in detail, those skilled in the pertinent art should understand that they can make various changes, substitutions and alterations herein without departing from the scope of the invention in its broadest form.

What is claimed is:

1. An integrated circuit, comprising:
   A. an external interface lead providing an input/output port for said integrated circuit;
   B. a phase locked loop having a voltage tune line coupled to a voltage controlled oscillator; and
   C. a series connection of a first switch and a second switch between the interface lead and the voltage tune line providing a bi-directional path between the interface lead and the voltage tune line, the series connection including one lead of a capacitor connected to the connection between the first switch and the second switch.

2. The integrated circuit as recited in claim 1 wherein said phase locked loop further includes an operational amplifier coupled to said voltage controlled oscillator via said voltage tune line, said first and second switch having a resistance when activated that is about a fourth of a drive resistance of said operational amplifier.

3. The integrated circuit as recited in claim 2 wherein said resistance and a capacitance of said capacitor cooperate to filter voltages associated with said voltage tune line and said input/output port.

4. The integrated circuit as recited in claim 2 wherein said voltage tune probe is configured to provide a connection between said voltage tune line and said input/output port when said first and second switch are activated to allow monitoring of said voltage tune line via said input/output port.

5. The integrated circuit as recited in claim 4 wherein said voltage tune probe is configured to provide a connection between said input/output port and said voltage tune line when said first and second switch are activated to apply a voltage to said voltage controlled oscillator via said input/output port to allow testing of the voltage controlled oscillator.

6. The integrated circuit as recited in claim 2 wherein said voltage tune probe is configured to deactivate said first and second switch to allow operation of said phase locked loop.

7. The integrated circuit as recited in claim 1 wherein said capacitor has a capacitance of about two pico-farads.

8. A phase locked loop, comprising:
an input node for receiving a reference frequency;
a phase detector including a first input, a second input and an output, said first input coupled to said input node;
an active compensation network including an input and an output, said input coupled to said output of said phase detector;
a voltage controlled oscillator including a control input coupled to said output of said active compensation network via a voltage tune line, and having an output providing an output of said phase locked loop; and
a voltage tune line probe coupled to said voltage tune line, the probe including a series connection of a first switch and a second switch between an external interface lead and the voltage tune line providing a bi-directional path between the interface lead and the voltage tune line, the series connection including one lead of a capacitor connected between the first switch and the second switch.

9. The phase locked loop as recited in claim 8 wherein said active compensation network further includes an operational amplifier having an output coupled to said voltage controlled oscillator via said voltage tune line and an input coupled to said phase detector, said first and second switch having a resistance when activated that is at most one fourth a drive resistance of said operational amplifier.

10. The phase locked loop as recited in claim 9 wherein said resistance and a capacitance of said capacitor cooperate to filter voltages associated with said voltage tune line and said interface lead.

11. The phase locked loop as recited in claim 9 wherein said voltage tune probe is configured to deactivate said first and second switch to allow operation of said phase locked loop.

12. The phase locked loop as recited in claim 9 wherein said active compensation network further includes a first resistor and capacitor network coupled between said phase detector output and said operational amplifier input and a second resistor and capacitor network coupled between said operational amplifier input and said operational amplifier output.

13. The phase locked loop as recited in claim 8 wherein said voltage tune probe is configured to provide a connection between said voltage tune line and said interface lead when said first and second switch are activated to allow monitoring of said voltage tune line via said interface lead.

14. The phase locked loop as recited in claim 13 wherein said voltage tune probe is configured to provide a connection between said voltage tune line and said interface lead when said first and second switch are activated apply a voltage to said control voltage controlled oscillator via said interface lead for testing said voltage controlled oscillator.

15. A voltage tune probe for use with a phase locked loop, comprising:
a first bidirectional switch coupled to a voltage tune line of said phase locked loop;
a bidirectional second switch coupled to said first switch and an external interface lead of an input/output port that provides an interface external to said phase locked loop; and
one lead of a capacitor coupled to the coupling of said first and second switches.

16. The voltage tune probe as recited in claim 15 further including a logic gate coupled to said first and second switches.

17. The voltage tune probe as recited in claim 16 wherein said logic gate is configured to control operation of said first and second switch.

18. The voltage tune probe as recited in claim 17 wherein said logic gate activates said first and second switch to provide a connection between said voltage tune line and said input/output port to allow monitoring of said voltage tune line via said input/output port.

19. The voltage tune probe as recited in claim 17 wherein said logic gate is further configured to activate said first and second switch to provide a connection between said voltage tune line and said input/output port to apply a voltage to a voltage controlled oscillator of said phase locked loop to test said voltage controlled oscillator.

20. The voltage tune probe as recited in claim 17 wherein said logic gate is further configured to deactivate said first and second switch to allow operation of said phase locked loop.

* * * * *